United States Patent
Mensinger

(10) Patent No.: US 6,196,889 B1
(45) Date of Patent: Mar. 6, 2001

(54) METHOD AND APPARATUS FOR USE AN ELECTRON GUN EMPLOYING A THERMIONIC SOURCE OF ELECTRONS

(75) Inventor: Brian E. Mensinger, Middletown, CT (US)

(73) Assignee: United Technologies Corporation, Hartford, CT (US)

( * ) Notice: Subject to any disclaimer, the term of this patent is extended or adjusted under 35 U.S.C. 154(b) by 0 days.

(21) Appl. No.: 09/210,632

(22) Filed: Dec. 11, 1998

(51) Int. Cl.⁷ ........................................... H01J 9/02
(52) U.S. Cl. .................................................... 445/35
(58) Field of Search ......................... 445/35, 34

(56) References Cited

U.S. PATENT DOCUMENTS

| | | | |
|---|---|---|---|
| 3,172,007 | 3/1965 | Hanks et al. | 315/14 |
| 3,701,915 | 10/1972 | Tsujimoto | 313/82 |
| 4,105,890 | 8/1978 | Movchan et al. | 219/121 EB |
| 4,126,811 | 11/1978 | Movchan et al. | 313/453 |
| 4,412,153 | 10/1983 | Kalbfus et al. | 315/111.81 |
| 4,665,297 | 5/1987 | Schiller et al. | 219/121 ET |
| 5,087,477 | 2/1992 | Giggins, Jr. et al. | 427/38 |
| 5,182,488 | 1/1993 | Hill et al. | 313/446 |
| 5,623,148 | * 4/1997 | Wenzel et al. | 250/427 |
| 5,686,785 | 11/1997 | Movchan et al. | 313/453 |
| 6,094,004 | * 7/2000 | Kim et al. | 313/428 |

* cited by examiner

Primary Examiner—Kenneth J. Ramsey

(57) ABSTRACT

A method includes providing an electron gun having a first head with a thermionic electron source and an accelerating electrode, and further includes replacing the first head with a second head having a power rating substantially different than that of the first head, and subsequently operating the electron gun without replacing the accelerating electrode. The electron gun may further include a platform spaced apart from the accelerating electrode and having an adjustably located locating member that engages a reference member on the head to position the head in three dimensions relative to the accelerating electrode. The platform may be adjustably spaced from the accelerating electrode in order vary the distance between the electron source and the accelerating electrode.

9 Claims, 3 Drawing Sheets

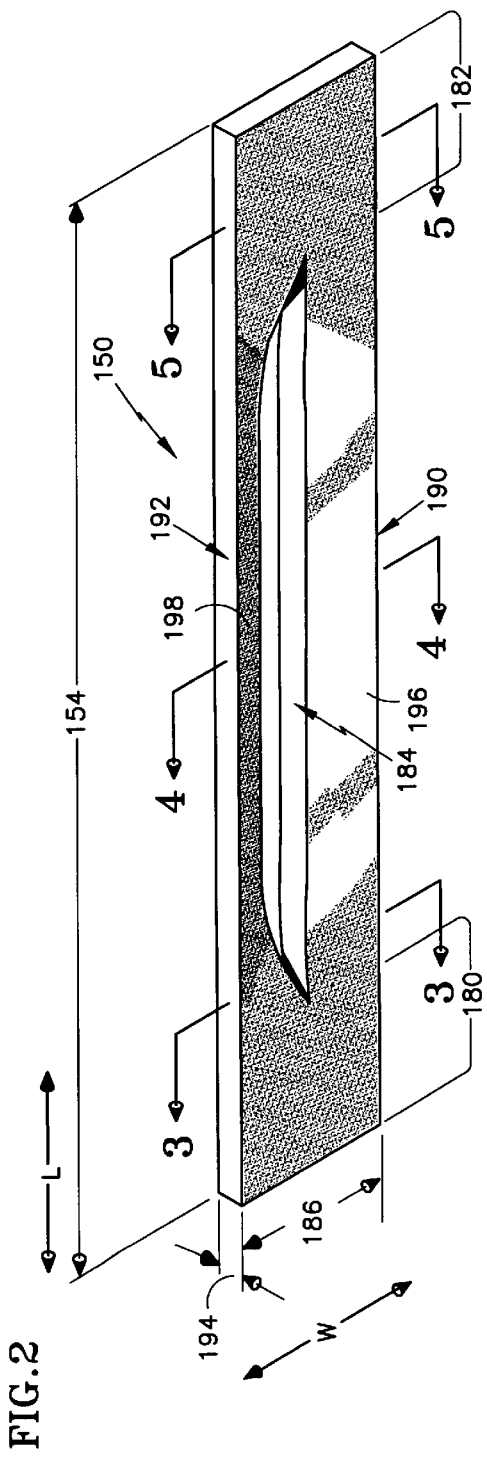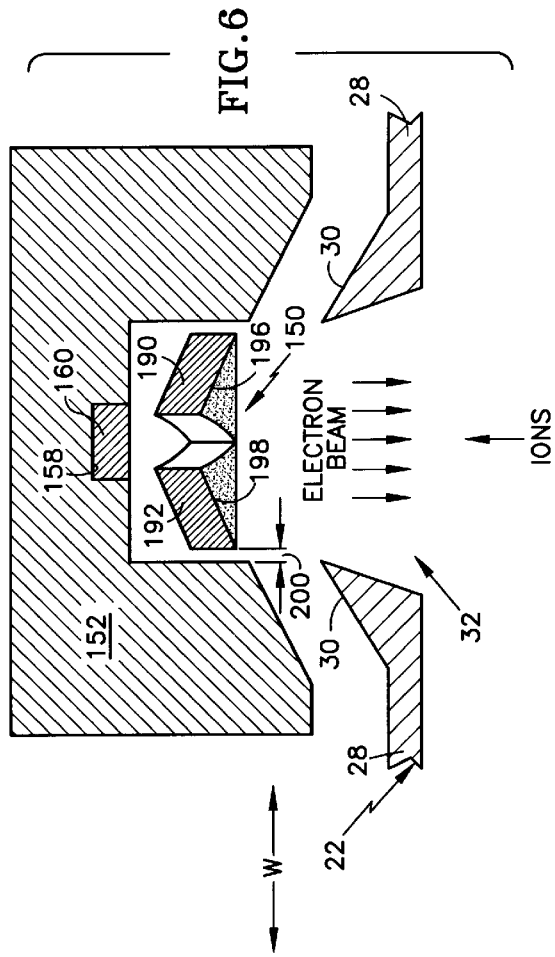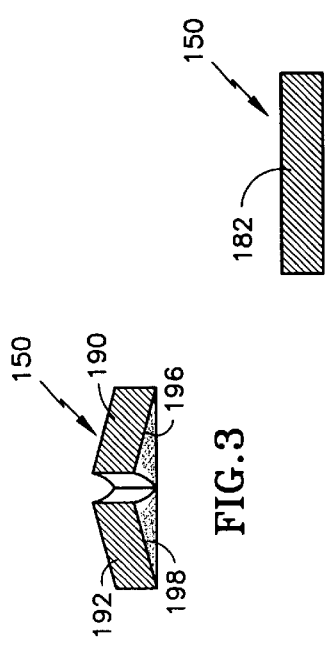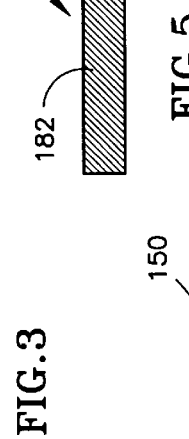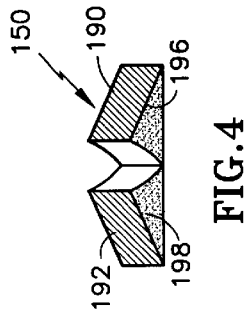

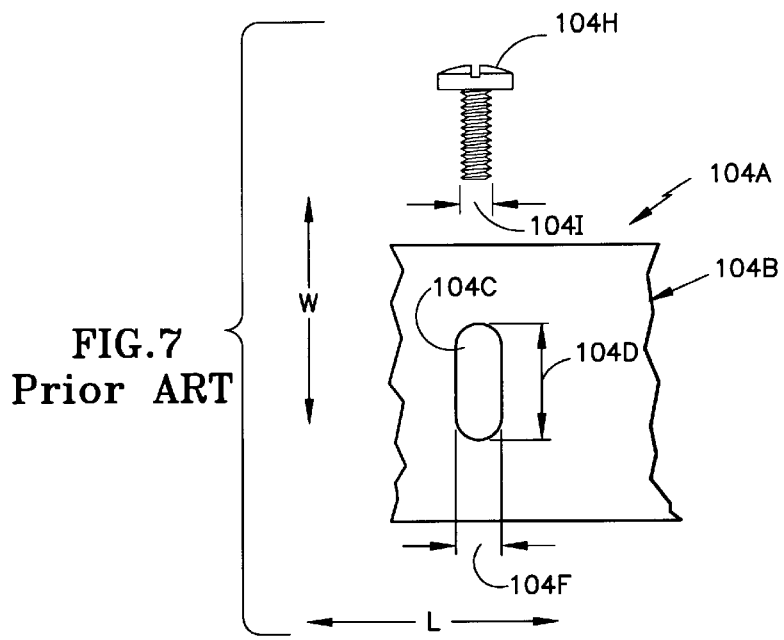
FIG. 7 Prior ART
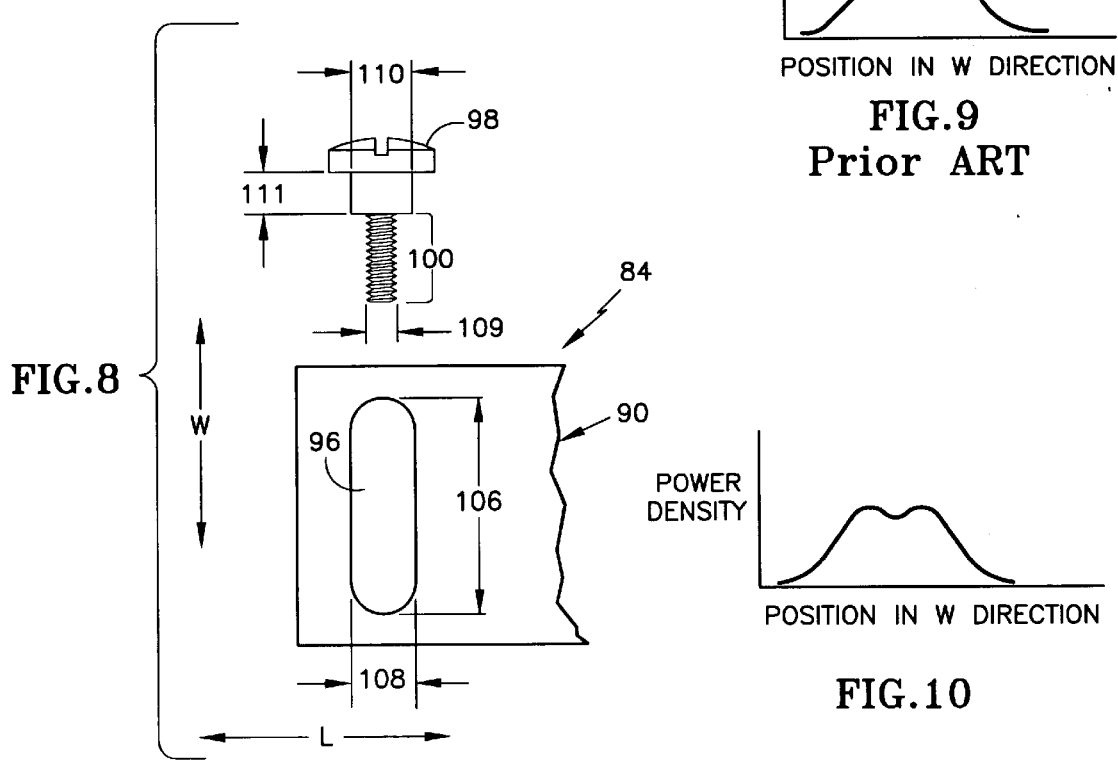
FIG. 8
FIG. 9 Prior ART
FIG. 10

METHOD AND APPARATUS FOR USE AN ELECTRON GUN EMPLOYING A THERMIONIC SOURCE OF ELECTRONS

RELATED APPLICATION

The subject matter herein may be disclosed and/or claimed in U.S. patent application Ser. No. 09/209,629, filed Dec. 11, 1998, entitled "APPARATUS FOR AN ELECTRON GUN EMPLOYING A THERMIONIC ELECTRON SOURCE".

TECHNICAL FIELD

This invention relates to an electron gun and more particularly to an electron gun of a type having a thermionic source of electrons disposed on a head, an accelerating electrode, and a platform to support and position the head relative to the accelerating electrode.

BACKGROUND

Electron beam furnaces are used to heat materials to produce vapors for deposition on an article. An electron beam furnace includes an electron gun, a deflection system, and a cooling system. The electron gun generates an electron beam. The deflection system directs the electron beam toward the material to be heated. The cooling system cools the electron gun to prevent it from overheating.

The electron gun typically includes an electron source, a focusing electrode, and an accelerating electrode. The electron source is typically a cathode heated by an electric current to cause the cathode to emit electrons. The focusing electrode is typically negatively charged to repel the electrons and thereby direct the electrons in a direction generally toward the accelerating electrode. The accelerating electrode is positioned downstream from the electron source and the focusing electrode. The accelerating electrode is typically less negatively charged than the electron source and the focusing electrode to cause the electrons to form into a beam and travel in the downstream direction.

In one known type of electron gun, the electron source and the focusing electrode are elongated and disposed in a head. The head is supported by a platform spaced apart from the accelerating electrode. This type of electron gun is reliable and available in many different power ratings. The physical size of the head, the accelerating electrode, and the platform of a given one of these electron guns depends on its power rating.

It is important that an electron gun to be used in an electron beam furnace generate an electron beam suitable for the type of material to be heated and the type of deposition sought for the article. Different types of materials and depositions require electron beams of different amounts of electron beam power and may require different electron beam shape. However, it is desirable to have electron beam guns operate in a space charge limited mode. In such mode, the above described type of electron guns generally perform best at a power equal to or slightly below its power rating. Consequently, no one of these electron guns can adequately generate electron beams for all of the electron beam powers required.

Whenever an electron gun in the electron beam furnace does not generate an electron beam suitable for the type of material to be heated and the type of deposition sought for the article, the traditional approach has been to remove the electron gun and replace it with an electron gun that provides a suitable electron beam. However completely replacing an electron gun can be difficult and time consuming. Moreover, the deflection system and the cooling system of the electron beam furnace are connected to the accelerating electrode of the electron gun and are designed to suit the physical size of the accelerating electrode and the power rating of the electron gun. Consequently, replacing the electron gun requires replacing the deflection system and the cooling system, thereby compounding effort involved.

SUMMARY OF THE INVENTION

An object of the present invention is to reduce the effort involved with providing an electron gun of the above described type to generate a suitable electron beam for a particular type of material and deposition.

The present invention is predicated in part on the recognition that the accelerating electrode of a first electron gun having a first power rating can be operated with a head from a second electron gun having a second power rating substantially different than the first power rating, to provide an electron beam comparable to that which would be provided by the second electron gun, and that such operation is facilitated by making the platform adjustable enough to be able to support and position the head of the second electron gun, which may be physically smaller than the head of the first electron gun.

According to a first aspect of the present invention, a method includes providing an electron gun having an accelerating electrode and a first head with a thermionic electron source, and further includes replacing the first head with a second head having a power rating substantially different than that of the first head, and subsequently operating the electron gun without replacing the accelerating electrode.

This method reduces the effort associated with providing an electron gun that generates an electron beam suitable for a particular type of material and deposition. As used herein substantially different means that one of the heads is at least twenty five percent less than the other of the heads. Using this method, suitable electron beams of various power levels can be generated by replacing the head of an electron gun without the need to replacing the accelerating electrode of the electron gun, thereby saving time. In one detailed embodiment, the power rating of the second head is at least twenty five percent less than the power rating of the first head. In another detailed embodiment, the accelerating electrode is connected to a deflection system and a cooling system, at least one of the deflection system and the cooling system is not replaced prior to operating the electron gun with the second head, thereby reducing the difficulty and the amount of time consumed.

According to a second aspect of the present invention, an apparatus for an electron gun has a head having a thermionic electron source and at least one reference member, an accelerating electrode, and a platform spaced apart from the accelerating electrode and having at least one locating member that engages the at least one reference member of the head to position the head in three dimensions relative to the accelerating electrode, wherein the at least one locating member is adjustably located and the location of the at least one locating member can be adjusted by at least nine millimeters (mm).

Such apparatus is useful in practicing the above described method, but is not limited to such. In order to operate the accelerating electrode of the first electron gun with the head of the second electron gun, it is desirable to be able to support and position the head on the platform of the first electron gun. However, as described above, the head of the second electron gun may be smaller in size than the head of the first electron gun. Providing the platform with locating members that are adjustably located by at least nine mm enables the platform to support and position heads of various sizes.

As described hereinbelow, although adjustably located locating members are known, until now, their adjustability was limited to less than five mm, being merely intended to compensate for manufacturing tolerances of components of the electron gun and to facilitate alignment of the electron source and the accelerating electrode.

According to a third aspect of the present invention, an apparatus for an electron gun has a head having a thermionic electron source, an accelerating electrode, and a platform that supports the head and is adjustably spaced from the accelerating electrode.

This apparatus enables the shape of the electron beam to be varied by varying the distance between the electron source and the accelerating electrode. The apparatus is useful in practicing the above described method, but is not limited to such.

These and other objects, features and advantages of the present invention will become more apparent in the light of the following detailed description, accompanying drawings, and claims.

BRIEF DESCRIPTION OF THE DRAWINGS

FIG. 2 is perspective view of a thermionic electron source in accordance with one embodiment of the present invention for use in the electron gun of FIG. 1;

FIG. 3 is a cross section view in the direction of 3—3 of FIG. 2, of the thermionic electron source of FIG. 2;

FIG. 4 is a cross section view in the direction of 4—4 of FIG. 2, of the thermionic electron source of FIG. 2;

FIG. 5 is a cross section view in the direction of 5—5 of FIG. 2, of the thermionic electron source of FIG. 2;

FIG. 6 is a cross section view in the direction of 6—6 of FIG. 1, of the focusing electrode and the thermionic electron source used in the electron gun of FIG. 1;

FIG. 7 is a side view of a prior art screw and a top view of a prior art spacer with an elongated bole;

FIG. 8 is a side view of a screw and a top view of a spacer of the electron gun of FIG. 1;

FIG. 9 is a graph of a power density distribution of an electron beam resulting from a prior art thermionic electron source; and FIG. 10 is a graph of a power density distribution of an electron beam resulting from the thermionic electron source of FIG. 2.

BEST MODE FOR CARRYING OUT THE INVENTION

Figure 1:
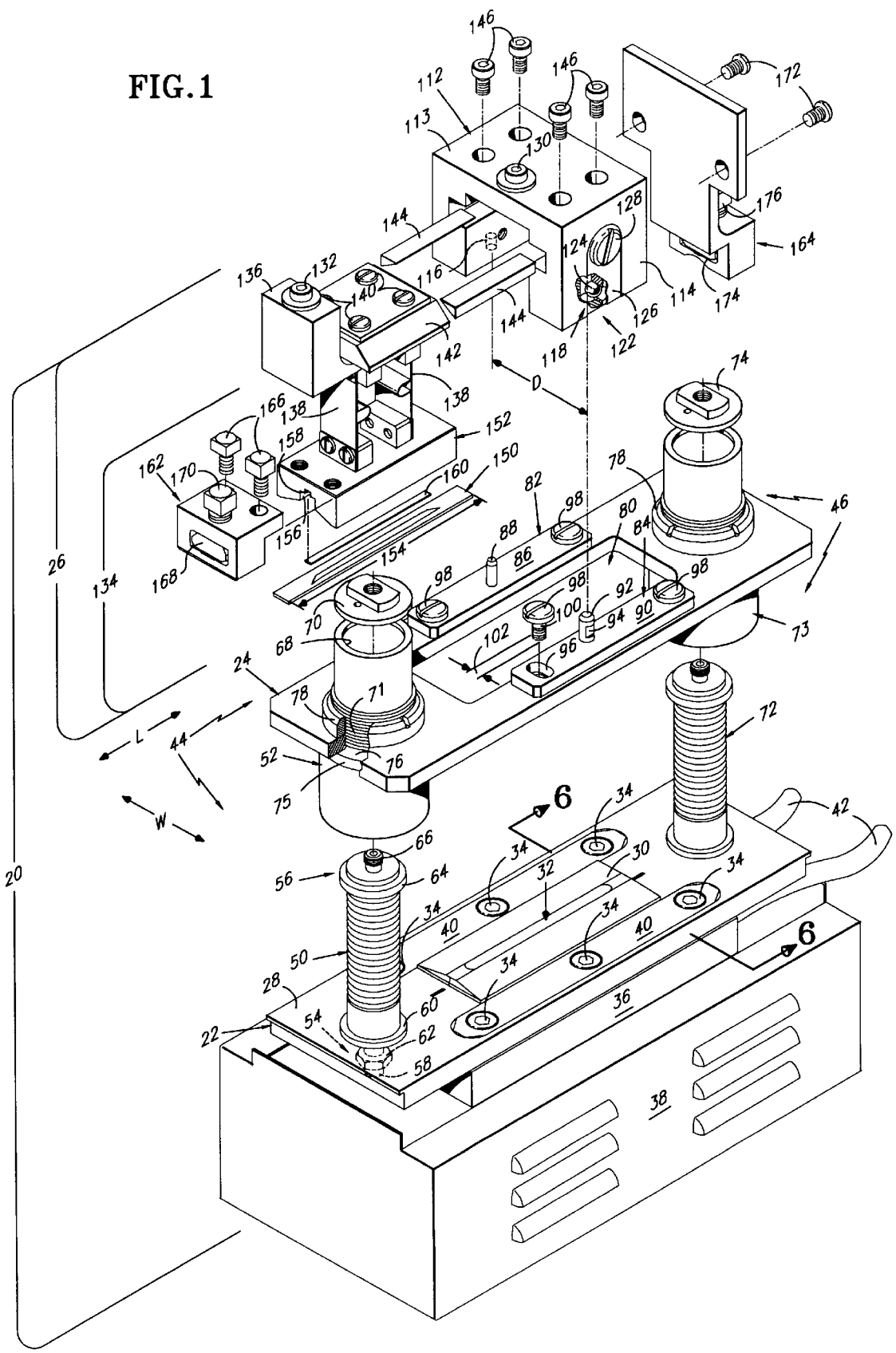
FIG. 1 is a perspective, partially exploded, partially cut away view of an electron gun.

The present invention is disclosed herein with respect to a best mode embodiment for use in an electron gun illustrated in FIG. 1. Referring now to FIG. 1, an electron gun 20 for an electron beam furnace (not shown) has an accelerating electrode 22, a platform 24, and a head 26. The electron gun 20 has a power rating of about sixty five kilowatts. The electron gun 20 is representative of in shape, but larger, than electron guns (not shown) having a power rating less than sixty five kilowatts, e.g., forty five kilowatts. The accelerating electrode 22 of the electron gun 20 has a plate portion 28 and a beam shaper portion 30. The beam shaper portion 30 is elongated and extends in a longitudinal direction L. The accelerating electrode 22 further has an elongated aperture 32 that extends in the longitudinal direction L and provides a path for electrons, generated by the head 26, to exit the electron gun 20. The accelerating electrode 22 may comprise a copper material and may be formed as one piece for example by milling. Alternatively, the accelerating electrode 22 may be an assembly wherein the plate portion 28 comprises a stainless steel material and the beam shaper portion 30 comprises a copper material.

A plurality of bolts 34 connects the accelerating electrode 22 to a cooling plate 36 and a deflection system 38. Washer plates 40 recessed in the accelerating electrode 22 help distribute the load applied by the bolts 34. The cooling plate 36 is part of a cooling system, represented in part by a pair of water pipes 42. The cooling system 42 and the deflection system 38 are specifically designed to suit the physical size of the accelerating electrode 22 and the power rating of the electron gun 20. For example, the cooling plate 36 is sized to contact as much of the surface area of the accelerating electrode 22 as is possible without creating interference to other structures on the accelerating electrode 22. This maximizes heat transfer between the accelerating electrode 22 and the cooling system 42 and thereby helps prevent the electron gun 20 from overheating. The cooling plate 36 and the deflection system 38 are illustrative of but physically larger than a cooling plate and a deflection system respectively suited to the physical size and the power rating of an electron gun having a power rating of forty five kilowatts. Consequently, the cooling plate 36 and the deflection system 38 are too large to connect to the accelerating electrode of an electron gun having a power rating of forty five kilowatts. The accelerating electrode 22 may be electrically grounded by way of its connection to the cooling plate 36 and the deflection system 38.

The accelerating electrode 22 supports a first platform support 44 and a second platform support 46. The first platform support 44 comprises a high voltage insulator 50 and an insulator cover 52. The high voltage insulator 50, which may comprise a ceramic material, has a first end 54 and a second end 56. The first end 54 has a threaded stud 58 that extends through a washer 60 and the accelerating electrode 22 and engages a nut 62 to retain the high voltage insulator 50 to the accelerating electrode 22. The second end 56 of the high voltage insulator 50 has a shoulder 64 and a threaded stud 66. The shoulder 64 abuts a collar 68 on the insulator cover 52. The threaded stud 66 extends through the insulator cover 52 and engages a threaded cap 70 to retain the high voltage insulator 50 to the insulator cover 52. The insulator cover 52 limits formation of deposits on the high voltage insulator 50. The insulator cover 52 further includes a threaded engagement surface 71. The second platform support 46 comprises a high voltage insulator 72, an insulator cover 73, and an insulator cover 74, which are identical to the high voltage insulator 50, the insulator cover 52, and the threaded cap 70 of the first platform support 44, respectively.

The first platform support 44 and the second platform support 46 each further comprise a support ring, represented by a support ring 75. The support rings 75 each have a threaded engagement surface (not shown) and a support surface, represented by a support surface 76. The threaded engagement surfaces of the support rings 75 engage the threaded engagement surfaces of the insulator covers 52, 73 to retain the support rings 75 to the insulator covers 52, 73. The support surfaces 76 of the support rings 75 provide support for the platform 24 and space the platform 24 apart from the accelerating electrode 22. Retaining rings 78 engage the insulator covers 52, 73 and retain the platform 24 on the support surfaces 76 of the support rings 75. Adjusting the spacing between one of the support surfaces 76 and the accelerating electrode 22 is accomplished by loosening one of the support ring 75 and the retaining ring 78, and subsequently tightening the other of the support ring 75 and the retaining ring 78. Adjusting the spacing between one or more of the support surfaces 76 and the accelerating electrode 22 in effect adjusts the spacing between the platform 24 and the accelerating electrode 22.

The platform 24, which supports the head 26 of the electron gun 40, has an opening 80. The platform 24 further has a first locating member 82 and a second locating member 84 disposed on opposite sides of the opening 80. The first locating member 82 comprises a spacer 86 and a projection 88 extending therefrom. The second locating member 84 comprises a spacer 90 and a projection 92 extending therefrom. Each of the projections may have a notch, represented by a notch 94, which are part of a detent mechanism described hereinbelow. The spacer 86 of the first locating member 82 and the spacer 90 of the second locating member 84 each have two holes, represented by a hole 96. Screws 98 extend through the holes 96 and engage the platform 24 to retain the first locating member 82 and the second locating member 84 to the platform 24. The screws 98 each have a head and a shank, represented by a shank 100. The shank 100 has a diameter 102. The holes 96 are preferably elongated relative to the diameter 102 of the shank 100 in a widthwise direction W, transverse to the longitudinal direction L, to provide a clearance between the spacers 86, 90 and the shank 100 of the screws 98. This clearance facilitates adjustment of the position of the locating member relative to the platform 24 and the accelerating electrode 22. If desired, the holes 96 may be elongated in more than one direction relative to the shank diameter 102. However, elongating the holes in only one direction relative to the shank diameter helps to prevent misalignment between a thermionic electron source, described hereinbelow, and the elongated aperture 32 of the accelerating electrode 22. Repositioning of the first locating member 82 or the second locating member 84 is accomplished by loosening one or both of the screws 98 that retain the locating member to the platform 24, positioning the locating member, and subsequently re-tightening the screws 98.

Referring now to FIG. 7, a prior art locating member 104A has a spacer 104B with a hole 104C that is elongated. The hole 104C has a dimension 104D of less than ten mm in the widthwise direction W. The hole 104C has a dimension 104F of about 6.5 mm in the longitudinal direction L. A screw 104H employed in connection with the hole 104C to position the locating member 104A has a head and a shank. The shank is threaded and has a diameter 104I of five mm. The dimensions of the screw 104H and the hole 104C result in clearance between the spacer 104B and the screw 104H and thereby result in adjustability of the locating member 104A. The adjustability in the widthwise direction W is less than five mm (less than 10 mm–5 mm). The adjustability in the longitudinal direction L is about 1.5 mm (about 6.5 mm –5 mm). The adjustability in the widthwise direction W and the adjustability in the lengthwise direction L are intended to compensate for manufacturing tolerances of components of the prior art electron gun (not shown) and to facilitate alignment of the electron source and the accelerating electrode in the prior art electron gun. Consequently, as will be understood in view of the discussion hereinbelow, there is less than desired adjustability with the prior art locating member 104A to position a head from an electron gun that has a power rating of forty five kilowatts, which is physically smaller than the head 26 of the electron gun 20.

Referring now to FIG. 8, in one embodiment of the present invention, the hole 96 has a dimension 106 at least fifteen nun in the widthwise direction W. The hole 96 has a dimension 108 of six mm in the lengthwise direction L. The shank 100 of the screw 98 has a portion with a collar and a portion that is threaded. The portion with the collar has a diameter 110 of 5.95 mm and a dimension 111 that is less than the thickness of the spacer 90. The portion that is threaded has a dimension 109 of 5 mm to engage the platform 24 (FIG. 1). The dimensions of the screw 98 and the hole 96 result in clearance between the spacer 90 and the screw 98 and thereby adjustability of the locating member 84. The adjustability in the widthwise direction W is at least nine mm (15 mm–6 mm). The adjustability in the lengthwise direction L is 0.05 mm (6 mm–5.95 mm). As will be evident in view of the discussion hereinbelow, the adjustability in this embodiment is enough to position the head 26 of the electron gun 20, and enough to position a head from an electron gun having a power rating of forty five kilowatts.

Referring again to FIG. 1, the head 26 includes a frame member 112 that is U shaped and comprises a stainless steel material. The frame member 112 has a first side wall 113 and a second side wall 114. The first side wall 113 has a first reference member 116 having the shape of a recess. The second side wall 114 has a second reference member 118 having the shape of a recess. The first reference member 116 and the second reference member 118 have a distance D between them. The distance D depends on the size of the head 26, which in turn depends on the power rating of the electron gun 20. For the sixty five kilowatt electron gun 20, the distance D is fifty mm, center to center. Note that for a forty five kilowatt electron gun, the distance between reference members is forty five mm, which is five mm (50 mm–45 mm) less than that of the electron gun 20. When the frame member 112 is placed on the platform 24, the first reference member 116 and the second reference member 118 engage the first locating member 82 of the platform 24 and the second locating member 84 of the platform 24, respectively, to position the head 26 on the platform 24 and thereby positioning the head 26 in three dimensions relative to the accelerating electrode 22.

The frame member 112 may further have a pair of catch assemblies, represented by a catch assembly 122. Each catch assembly 122 has a ball 124 and a spring 126. The catch assemblies 122 cooperate with the notches 94 in the projections 88, 92 to define a detent mechanism that retains the head 26 to the platform 24. For example, the ball 124 engages the notch 94 in the projection 92 of the second locating member 84. The spring 126 biases the ball 124 toward the notch 94. A pair of screws, represented by a screw 128, adjusts the bias provided by the springs 126.

The head 26 further includes a first terminal 130, a second terminal 132, and a thermionic cathode assembly 134. The first terminal 130 engages the frame member 112. The second terminal 132 engages a conductor 136. The conductor 136 mechanically and electrically connects the second terminal 132 to a pair of nonmagnetic, spring conductors 138 that extend through the opening 80 of the platform 24 and support the thermionic cathode assembly 134. A plurality of screws 140 connects the conductor 136 to an insulator 142. Wedge shaped members 144 clamp the insulator 142 to the frame member 112. A plurality of screws 146 biases the wedge shaped members 144 toward the insulator 142.

The thermionic cathode assembly 134 includes a thermionic electron source 150 and a focusing electrode 152. The thermionic electron source 150 and the focusing electrode 152 are spaced apart from one another and each extends in the longitudinal direction L. The thermionic electron source 150 is one piece and may comprise a tungsten material. The focusing electrode 152 extends partially around the thermionic electron source 150 along a portion of a length 154 of the thermionic electron source 150. The focusing electrode 152 has a notch 156 that extends in the longitudinal direction L. The notch 156 is bordered by a recessed surface 158. An ion trap 160 extends longitudinally and into the notch 156 so as to be between the recessed surface 158 of the focusing electrode 152 and the thermionic electron source 150. The ion trap 160 is sacrificial in that it is expected that the ion trap 160 will be bombarded by ions and erode over time. The ion trap 160 reduces the amount of bombardment and erosion experienced by the focusing electrode 152. The ion trap 160 is less costly to replace than the focusing electrode and may comprise a carbon material. Note that the opening 80 of the platform 24 is large enough for the thermionic cathode assembly 134 to pass through so as to facilitate positioning the thermionic cathode assembly 134 proximate to the accelerating electrode 22.

The head 26 further includes a first holder 162 and a second holder 164. The first holder 162 is mechanically and electrically connected to the focusing electrode 152 by fasteners 166. The first holder 162 has a clamping plate 168 and a screw 170. The screw 170 engages the clamping plate 168 and thereby causes it to tightly engage the thermionic electron source 150. The second holder 164 is mechanically and electrically connected to the frame member 112 by fasteners 172. The second holder 164 has a clamping plate 174 and a screw 176. The screw 176 engages the clamping plate 174 and thereby causes it to tightly engage the thermionic electron source 150.

Referring now to FIGS. 2–5, the thermionic electron source has a first end portion 180, a second end portion 182, and an aperture disposed therebetween 184. The aperture 184 extends a portion of the length 154 and a portion of a width 186 of the thermionic electron source 150. The thermionic electron source 150 further comprises a first longitudinal portion 190 and a second longitudinal portion 192 that extend in the longitudinal direction L and are spaced apart from one another by the aperture 184. The first end portion 180 and the second end portion 182 rigidly join the first longitudinal portion 190 and the second longitudinal portion 192 together. The thermionic electron source may be generally uniform in thickness 194. As illustrated, the aperture 184 diminishes in width (i.e., tapers) near the ends of the first longitudinal portion 190 and the second longitudinal portion 192, although the aperture is not limited to such. The tapering helps to reduce buildup of stress and aids fabrication of the thermionic electron source.

Referring also now to FIG. 6, the first longitudinal portion 190 has a surface 196 that opposes the accelerating electrode 22; the second longitudinal portion 192 has a surface 198 that opposes the accelerating electrode 22. The surface 196 and the surface 198 may be inclined and face toward each other. Due to the incline, the thermionic electron source 150 may have a widthwise cross section having the shape of a chevron, as illustrated in FIG. 4. The incline of the surfaces 196, 198 may diminish near the ends of the longitudinal portions in an effort to minimize stress. Making the surfaces 196, 198 inclined rather than coplanar with each other is a way to increase to the width of the aperture without decreasing the surface area of the surfaces 196, 198. Note that the power rating of the electron gun 20 is related to the surface area of the surfaces that face toward the accelerating electrode 22. Depending on the incline and the width of the aperture 184, the thermionic electron source 150 may have almost as much surface area facing toward the accelerating electrode 22 as the thermionic electron source 20 would have in the absence of the aperture 184. The thermionic electron source 150 and the ion trap 160 are preferably aligned with the elongated aperture 32 of the accelerating electrode 22, to maximize the benefit of the aperture and the ion trap described below.

The thermionic electron source 150 may be fabricated using any suitable method including but not limited to pressing, rolling, and machining (including but not limited to electrical discharge machining and laser machining) and combinations thereof The thermionic electron source 150 may be fabricated from a thermionic electron source that does not have an aperture 184 and has been used in the electron gun 20 and undergone ion bombardment.

For the electron gun 20, which has a power rating sixty five kilowatts, the thermionic electron source 150 has a length 154 of one hundred mm and a width 186 of about three mm. The focusing electrode 152 (FIGS. 1, 6) has a length of sixty five mm and a width of about thirty two mm. There is clearance 200 of about 0.5 millimeter between the thermionic electron source 150 and the focusing electrode 152. The sacrificial ion trap 160 (FIGS. 1, 6) has a length equal to that of the focusing electrode 152 and has a width in a range of about 1.5 mm to about two mm. The length of the aperture 184 is about sixty mm, which is about ten percent less than the sixty five millimeter length of the focusing electrode 152. The width of the aperture 184 is about 0.75 mm, which is about one quarter of the width 186 of the thermionic electron source 150. Note that the length 154 of the thermionic electron source 150 and the length of the focusing electrode 152 typically depend on the power rating of the electron gun, but the width 186 of the thermionic electron source and the width of the focusing electrode 152 typical do not depend on the power rating of the electron gun. For example, for an electron gun having a power rating of forty five kilowatts, the thermionic electron source 150 has a length 154 of eighty nun and a width 186 of about three mm. The focusing electrode 152 has a length of forty five mm and a width of about thirty two mm.

In operation, the first terminal 130 and the second terminal 132 are connected to a power supply (not shown). The power supply provides a source of electric current for the thermionic electron source 150. The electric current flows through the first terminal 130, the second holder 164, the thermionic electron source 150, the first holder 162, the focusing electrode 152, the spring conductors 138, the conductor 136, and the second terminal 132. As the electric current flows through the thermionic electron source 150 it results in heating thereof, to a relatively high temperature, but typically below the melting temperature of tungsten, causing the thermionic electron source 150 to emit electrons. The voltage across the thermionic electron source 150 is typically less than ten volts. Because the heating for the thermionic electron source results from an electric current, the electron gun is referred to as directly heated. A second power (not shown) provides the second terminal 132 with a negative voltage potential (typically about −20 kilovolts), which is in turn provided to the first holder 162 and the focusing electrode 152 through the conductor 136 and the spring conductor 138. The negative voltage potential causes the focusing electrode 152 to repel the electrons and thereby direct the electrons in a direction generally toward the accelerating electrode 22. The accelerating electrode 22 is typically at an electrical ground voltage potential by way of the connection between the accelerating electrode 22, the cooling system 42, and the deflection system 38. The accelerating electrode causes the electrons to form into a beam and travel in the downstream direction. The electron beam exits the electron gun 20 through the elongated aperture 32 of the accelerating electrode 22.

The electron beam from the electron gun typically extends in the longitudinal direction L and the widthwise direction W, and has a generally rectangular cross section in a plane containing the longitudinal direction L and the widthwise direction W. The electron beam has a power density that varies across its width (i.e., in the widthwise direction W). Referring now to FIG. 9, a graph illustrates a power density distribution obtained from the electron gun with a prior art thermionic electron source. The power density distribution has characteristics similar to that of a Gaussian distribution. Referring now to FIG. 10, a graph illustrates a power density distribution obtained from the electron gun 20 with the thermionic electron source 150. The power density distribution has characteristics similar to that of a Gaussian distribution, but with some variation due to the aperture 184 of the thermionic electron source.

The shape and the power density distribution of the electron beam depends on the distance between the thermionic electron source 150 and the accelerating electrode 22, and also depends on the difference between the voltage potential of the thermionic electron source 150 and the voltage potential of the accelerating electrode 22. However, because the platform 24 is adjustably spaced from the accelerating electrode 22, various electron beam shapes and various power density distributions may be obtained by moving the platform 24 closer to or further away from the accelerating electrode 22, without the need to vary the voltage potential between the thermionic electron source and the accelerating electrode. There is preferably at least one inch of adjustability to make possible a wide range of electron beam shapes and power density distributions.

The electron beam is used in the electron beam furnace (not shown) to vaporize materials for deposition on articles. Positively charged ions are produced as a result of the vaporization and of the material in the electron beam furnace. Some of these ions have a direction of travel opposite that of the electrons in the electron beam causing the ions to travel through the elongated aperture in the accelerating electrode and toward the thermionic electron source. The ions have the potential to bombard and erode the thermionic electron source.

However, because the thermionic electron source has an aperture, many of these positively charged ions do not strike the thermionic electron source 150, but rather pass through the aperture and strike the sacrificial ion trap. The thermionic electron source 150 is thus less susceptible to ion bombardment and thus has a longer operating life than previous ribbon type thermionic electron sources. The life expectancy of the thermionic electron source depends on the operating conditions, however, for a given set of operating conditions, the life expectancy of the thermionic electron source is about two times greater than it would be without the aperture 184. Moreover, because the improved electron source is one piece, use of the electron source does not require support and relative positioning of multiple emitters such as that required by an electron source having two separate and parallel emitters. In addition, the one piece construction may make the electron source more rigid and thus more durable and less likely to deform than an electron source having two separate emitters.

As stated above, it is important that an electron gun to be used in an electron beam furnace generate an electron beam suitable for the type of material to be heated and the type of deposition sought for the article. Different types of materials and depositions require electron beams of different amounts of electron beam power and may require different electron beam shape. It is also desirable to have the electron beam gun operate in a space charge limited mode. However, the sixty five kilowatt electron gun operates in space charge limited mode within a power range from about forty three kilowatts to about seventy kilowatts. Consequently, the sixty five kilowatt electron gun cannot adequately generate electron beams for all of the electron beam powers required.

It has been determined that the accelerating electrode 22 of the electron gun 20 can be operated with the head 26 of the electron gun 20 or alternatively with the head of a second electron gun having a power rating at least twenty five percent less than the sixty five kilowatt power rating of the electron gun 20. In this alternative, the electron beam that results is comparable to that which would be generated by the second electron gun. For example, an electron gun comprising the accelerating electrode 22 of the sixty five kilowatt gun and the head of a forty five kilowatt gun generates an electron beam comparable to that generated by the forty five kilowatt electron gun. A forty five kilowatt electron gun operates in space charge limited mode within a power range from about twenty seven kilowatts to about forty eight kilowatts. The accelerating electrode 22 of the electron gun 20 and the head of a forty five kilowatt electron gun operate together in space charge limited mode within the same range as that of the forty five kilowatt electron gun. Since the accelerating electrode 22 is not replaced and the resulting electron gun operates at a power less than the power rating of the electron gun 20 (sixty five kilowatts), there is no need to replace the deflection system 38 or the cooling system 42. Therefore, suitable electron beams of various power levels can be generated without replacing the accelerating electrode 22 of the electron gun 20, the deflection system 38 or the cooling system 42, thereby reducing the effort involved.

Providing locating members 82, 84 that are adjustably located by at least nine mm facilitates the operation of the accelerating electrode 22 of the electron gun 20 with the head of a second electron gun that may be smaller in size than the head 26 of the sixty-five kilowatt electron gun 20. The distance between the first locating member and the second locating member 84 can be sufficiently varied so as to correspond to the distance D between the reference members of the head of the second electron gun. For example, as stated above, for a forty-five kilowatt electron gun, the distance between reference members on the head is forty-five mm, which is five mm (50 mm–45 mm) smaller than that of the electron gun 20. In contrast, the prior art locating member 104A has adjustability of less than five mm and is intended to compensate for manufacturing tolerances of components of the prior art electron gun and to facilitate alignment of the electron source and the accelerating electrode in the prior art electron gun. Consequently, there is less than desired adjustability with the prior art locating member 104A to position a head that is five mm smaller than the head 26 of the electron gun 20.

In regard to the locating members 82, 84 and the reference members 116, 118, although disclosed with respect to two locating members and two reference members, all that is required is at least one locating member and at least one reference member. The adjustability may be whatever is appropriate to facilitate support and positioning of heads from other electron guns. The spacing is preferably at least nine mm so as to accommodate the different distances encountered between the reference members of the head 26 of the electron gun 20 and the reference members of the head of an electron gun having a power rating of forty-five kilowatts. The locating members may comprise recesses or projections.

In regard to the platform supports 44, 46, although shown with two platform supports, all that is required is at least one platform support. The platform supports need not comprise an insulator 50 and an insulator cover 52. Any suitable type of engagement surface may be used. The platform supports need not be the same as each other. Although disclosed as having a support ring 75 that engages an insulator cover 52, the platform supports 44, 46 are not limited to such and may employ a support member of any shape, including, but not limited to, one or more pins.

However, it should be understood that the adjustable locating members 82, 84 and the adjustable platform supports 44, 46 are not required to practice the method of the present invention. Thus, the accelerating electrode 22 of the electron gun 20 can be operated with the head of a second electron gun without the presence of the adjustable locating members 44, 46 or the adjustable platform supports 82, 84. For example, the head of the second electron gun may be modified to fit on the platform, the platform may be modified in some other way to support and position the various heads, or a plurality of different platforms may be employed.

Although shown with one focusing electrode 152 and one accelerating electrode 22, there may be any number of focusing and accelerating electrodes. The thermionic electron source 150 need not have an aperture 184. Nor must there be a sacrificial ion trap 160.

Furthermore, although described with respect to an electron gun 20 having a power rating of sixty-five kilowatts, the present invention may be used with electron guns of any power rating.

While the present invention has been described with reference to a best mode embodiment, this description is not meant to be construed in a limiting sense. Various modifications of the best mode of embodiment, as well as additional embodiments of the invention, will be apparent to persons skilled in the art upon reference to this description, without departing from the spirit of the invention, as recited in the claims appended hereto. It is therefore contemplated that the appended claims will cover any such modifications or embodiments as fall within the true scope of the invention.

What is claimed is:

1. A method comprising:
   providing an electron gun having a first head and an accelerating electrode, the first head having a power rating and a thermionic electron source;
   replacing the first head with a second head, the second head having a power rating and a thermionic electron source, one of the power rating of the first head and the power rating of the second head being at least twenty-five percent less than the other of the power rating of the first head and the power rating of the second head; and
   subsequently operating the electron gun without replacing the accelerating electrode.

2. The method of claim 1 wherein the power rating of the second head is at least twenty-five percent less than the power rating of the first head.

3. The method of claim 2 wherein the thermionic electron source of the first head and the thermionic source of the second head each extends in a longitudinal direction.

4. The method of claim 2 wherein the power rating of the second head is at least thirty percent less than the power rating of the first head.

5. The method of claim 2 wherein the accelerating electrode is connected to a cooling system and a deflection system and the step of subsequently operating is carried out without replacing greater than one of the cooling system and the deflection system.

6. The method of claim 5 wherein the step of subsequently operating is carried out without replacing either of the cooling system and the deflection system.

7. The method of claim 6 wherein the thermionic electron source of the first head, the thermionic source of the second head, and the accelerating electrode each extends in a longitudinal direction.

8. The method of claim 1 wherein the first head has at least one reference member and the second head has at least one reference member, the electron gun further has a platform that supports the head and has at least one adjustably located locating member that engages the at least one reference member of the first head, the location of the at least one locating member is adjustable by at least nine millimeters, and the step of replacing further includes adjusting the location of the adjustably located locating members so that the platform supports the second head and the at least one adjustably located locating member engages the at least one reference member of the second head.

9. The method of claim 1 wherein the electron gun further comprises at least one platform support supported by the accelerating electrode and having a support surface that is adjustably spaced from the accelerating electrode and supports the platform, and the step of replacing further includes adjusting the spacing between the accelerating electrode and the platform.

* * * * *